United States Patent [19]
Ang

[11] Patent Number: 4,729,009
[45] Date of Patent: Mar. 1, 1988

[54] GATE DIELECTRIC INCLUDING UNDOPED AMORPHOUS SILICON

[75] Inventor: Saw T. Ang, Garland, Tex.

[73] Assignee: Texas Instruments Incorporated, Dallas, Tex.

[21] Appl. No.: 832,919

[22] Filed: Feb. 20, 1986

[51] Int. Cl.$^4$ .................... H01L 29/78; H01L 29/40
[52] U.S. Cl. .................... 357/54; 357/43.15; 357/23.4; 357/59; 357/2
[58] Field of Search .............. 357/23.4, 23.15, 59 R, 357/59 G, 2, 54, 60

[56] References Cited

U.S. PATENT DOCUMENTS

| | | | |
|---|---|---|---|
| 3,996,656 | 12/1976 | Cook, Jr. | 357/23.15 |
| 4,521,794 | 6/1985 | Murase et al. | 357/63 |
| 4,656,497 | 4/1987 | Rogers et al. | 357/54 |

FOREIGN PATENT DOCUMENTS 59-207673 11/1984 Japan ................... 357/2

OTHER PUBLICATIONS

Arthur J. Learn, "Modeling of the Reaction for Low Pressure Chemical Vapor Deposition of Silicon Dioxide", *Journal of the Electrochemical Society*, vol. 132, No. 2, pp. 390-393, Feb. 1985.

J. Nulman et al., "Rapid Thermal Processing of Thin Gate Dielectrics Oxidation of Silicon", *IEEE Elec. Dev. Ltrs.*, vol. EDL 6, No. 5, May 1985.

C. Y. Ting, "Using Titanium Nitride and Silicon Nitride for VLSI Contacts", *IBM Technical Disclosure Bulliten*, vol. 24, No. 4, Sep. 1981, pp. 1976-1977.

H. J. Herzog et al., "X-Ray Investigation of Boron-and Germanium Doped Silicon Epitaxial Layers", *J. Electrochem. Soc., Solid State Science and Technology*, Dec. 1984, pp. 2969-2974.

F. E. Holmes et al., "VMOS-A New MOS Integrated Circuit Technology", *Solid State Electronics*, vol. 17, pp. 791-797, 1974.

Taher Daud, "Submicron Silicon MOSFET", *NASA Tech. Briefs*, p. 40, Jan./Feb., 1986.

*Primary Examiner*—Andrew J. James
*Assistant Examiner*—John Lamont
*Attorney, Agent, or Firm*—Richard A. Bachand; James T. Comfort; Melvin Sharp

[57] ABSTRACT

A dual dielectric gate system utilizes a dual dielectric system with a first silicon dioxide dielectric film or layer at the monocrystalline substrate surface, or termination. The substrate is of silicon optionally counterdoped with germanium. The dual dielectric system includes a dielectric film at the substrate surface of thicknesses of from 200Å to 1000Å (or greater). A layer of undoped amorphous silicon and a second layer of silicon dioxide, respectively overlie the first layer silicon dioxide, and an aluminum gate metal layer overlies the second silicon dioxide layer. The structure can be patterned by selectively patterning photoresist and a dry or a dry/wet etch processes. The structure is patterned and etched as desired. The system has enhanced surface mobilities due to lower oxide fixed charge density and a higher dielectric breakdown strength, is applicable to wide variety of MOSFET applications, and is inherently less electrostatic discharge (ESD) sensitive than conventional gate structures due to the distributed electric field.

11 Claims, 1 Drawing Figure

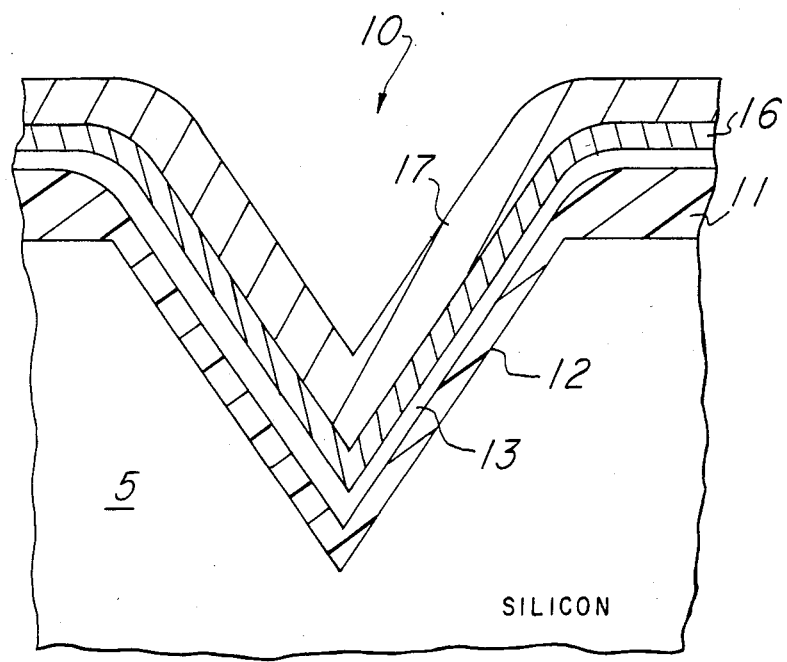

GATE DIELECTRIC INCLUDING UNDOPED AMORPHOUS SILICON

BACKGROUND OF THE INVENTION

1. Field of the Invention

This invention relates to improvement in MOSFET devices, and more particularly to a dual dielectric gate system for use in MOSFET devices, and to methods for making such devices.

2. Description of Related Art Including Information Disclosed under §§ 1.97-1.99

A significant yield loss in MOSFET device fabrication is due to particulates during silicon dioxide growth or subsequent metal processing. Thicker dielectrics to reduce these effects tend to accordingly reduce the device transconductance. Moreover, conventional metal or polysilicon gate structures are unforgiving with respect to field stresses, and hence, are ESD sensitive. Conventional silicon dioxide gate systems are sensitive to moisture due to trapping effects.

Gate oxide defects account for one of the largest yield loss mechanisms in MOSFET devices. This failure mechanism is more acute in power VMOS devices where the channel region resides on a plane 54.7° oblique to the planar <100> surface. A thick silicon dioxide gate is imperative to reduce the yield loss due to pin-holes or other defects associated with thin oxides. Unfortunately, this thick gate oxide reduces the device transconductance, a critical device parameter which is proportional to the specific capacitance of the gate oxide. The present polysilicon gate technology employs a thick (typically 5,000 Å) layer of phosphorous doped polysilicon overlaying the thermal silicon dioxide. This heavily doped polysilicon layer serves as the gate electrode of the MOSFET. Although this thick phosphorous doped polysilicon gate helps to protect the underlying gate oxide during subsequent chemical processing, it does not alleviate the problem of gate-to-substrate shorts through the pin-holes or micropores in the thin silicon dioxide. Moreover, the contacting aluminum to the heavily phosphorous doped polysilicon tends to suffer from a galvanic corrosion in the presence of moisture, and thereby, creating a serious reliability failure mechanism.

A dual dielectric gate structure of aluminum/silicon nitride/silicon dioxide has been employed. Although silicon nitride is impervious to alkali ion migration, it suffers from deleterious memory effect (when used for a non-memory device) and has only a slight permittivity advantage over silicon dioxide with a dielectric constant between 5.8 and 6.1. Deposited silicon nitride films have a large amount of built-in tensile stress (approximately $5 \times 10^9$ dyne/cm$^2$) when grown at 700° C., as a result, peeling and cracking is a common problem in silicon nitride films.

Stress and strain at the monocrystalline/silicon dioxide interface also has been a problem, because the interface stress and strain influence to a large extent the electronic properties of the silicon dioxide. Thermally grown silicon dioxide normally is in a state of compressive stress. Weaker chemical bond strength at the monocrystalline/silicon dioxide interface results from the difference in stress and strain between the monocrystalline silicon and silicon dioxide. Strain relief has been demonstrated in heavily boron doped silicon epitaxial layers when counterdoped with germanium atoms due to its larger atomic radius compared to boron and silicon by Herzog, "X-Ray Investigation of Boron- and Germanium-Doped Silicon Epitaxial Layers", J. Electrochem. Soc.: *SOLID-STATE SCIENCE AND TECHNOLOGY,* Dec. 1984, pp. 2969-2974.

SUMMARY OF THE INVENTION

This invention proposes a dual dielectric gate system having a silicon dioxide dielectric film at the surface or termination of a monocrystalline silicon substrate, optionally counterdoped with germanium. The system overcomes the deficiencies described above with respect to the prior art, having enhanced surface mobilities due to lower oxide fixed charge density by incorporating germanium in thermally grown silicon dioxide and the strain relief in the silicon dioxide. This gate system is applicable to wide variety of MOSFET applications and is inherently less electrostatic discharge (ESD) sensitive than conventional gate structures due to the distributed electric field.

Thus, the dual dielectric concept improves gate performance by protecting and enhancing the dielectric nearest the monocrystalline region by serving to protect the underlying silicon dioxide, to distribute fields in the duel dielectric, to current limit defects to the underlying silicon dioxide, to reduce the oxide fixed charge density and mobile ion density of the silicon dioxide, to desensitize silicon dioxide with respect to metal processing, and to enhance dielectric breakdown strength. This invention further enhances the ESD capability of gate structures. Finally, this invention is compatible with present high volume, low cost manufacturing techniques.

BRIEF DESCRIPTION OF THE DRAWING

The invention is illustrated in the accompanying drawing, in which:

FIG. 1 is a side cross-sectional view of a dual dielectric gate structure in accordance with the invention constructed over a non-planar VMOS gate region in accordance with the method of the invention.

DETAILED DESCRIPTION OF THE PREFERRED EMBODIMENTS

With reference now to FIG. 1, and in accordance with the invention, a dual dielectric system 10 is shown in use with a VMOS device. (VMOS devices are known in the art, for example, as shown by Holmes et al, "VMOS-A New MOS Integrated Circuit Technology", Solid State Electronics, Vol. 17, p. 791 (1974), said article being incorporated herein by reference as background. It will be appreciated that although the invention is illustrated in the context of a VMOS device, it is applicable to wide variety of MOSFET applications.

The gate system 10 has a silicon dioxide dielectric film 11 at the surface or termination 12 of a monocrystalline substrate, and is grown after conventional chemical clean up using furnace thermal oxidation or rapid thermal oxidation in a rapid thermal annealer using tungsten-halogen lamps as the heating source. Rapid thermal oxidation is typically performed at 1150° C. for 4 minutes with dry oxygen in a rapid thermal processor, such as the processor distributed by A G Associates, Heatpulse 2101, Rapid Thermal Processing System, Palo Alto, CA. Typical silicon dioxide thicknesses can vary from 200 Å to 1,000 Å, and preferably between 475 to 525 Å. An argon post annealing cycle of about 30 second at the growth temperature is carried out after oxidation.

An undoped layer of amorphous silicon 13 is then deposited on top of the silicon dioxide in an LPCVD reactor by the pyrolysis of monosilane ($SiH_4$) in the temperature range of 540° C. to 580° C. The thickness of this undoped amorphous silicon is typically 500°-1000°. To control the deposition rate of the amorphous silicon, the monosilane is diluted with an inert gas, usually argon, with the monosilane being typically 5% by volume. Low system pressure in the LPCVD reactor is also essential to achieve good uniformity across the wafer; a typical flow rate of the argon carrier gas is 50 cc/min. In cases where a lower deposition temperature is desired, disilane ($Si_2H_6$) can be substituted for which a typical deposition temperature is around 450° C. to 500° C. There are many advantages of this metal-amorphous silicon-oxide-monocrystalline silicon (MSOS) over a more conventional metal-nitride-oxide-silicon (MNOS) gate. The amorphous silicon has a higher dielectric constant of 11.7 compared to the dielectric constant of silicon nitride about 6. Hence, a thicker layer of amorphous silicon can be used without the deleterious effect of lowering the effective gate capacitance per unit area. Amorphous silicon can be deposited to a much lower temperature (450°-580° C.) than silicon nitride. Due to the lower stress of the amorphous silicon compared to silicon nitride, less stress is exerted to the underlying silicon dioxide, which helps preserve the integrity of the underlying silicon dioxide. Due to the charge compensation effects of the undoped amorphous silicon on the underlying silicon dioxide, the effective oxide fixed charge density of this dielectric system is lower than the conventional silicon dioxide gate.

Aluminum-amorphous silicon interphase reaction begins at temperatures of nearly half the eutectic melting point of 577° C. This interphase reaction would occur during the hydrogen annealing of microalloy temperature of 450° C. To circumvent this aluminum-silicon interphase problem, a thin (100-200 Å) layer 16 of chemical-vapor-deposited silicon dioxide is deposited over the amorphous silicon layer 13. This is carried out in a LPCVD reactor at a typical deposition temperature of between 400° to 420° C. Although any LPCVD reactor could be utilized, it has been found that superior quality films can be achieved using a dome reactor, known in the art, as described, for example by Learn, "Modeling of the Reaction for Low Pressure Chemical Vapor Deposition of Silicon Dioxide", Journal of the Electrochemical Society, Vol. 132, No. 2 Feb. 1985, pp. 390-393. A pyrolysis of undiluted monosilane (250 cc/min) in the presence of oxygen (250 cc/min) is performed at 400° to 420° C. with a pressure of 100 mT. It is very important to prevent the gate metal from reacting with the amorphous silicon film, thus, a gate metal layer 17 is evaporated or sputtered over the LPCVD $SiO_2$ layer 16. In the embodiment shown, an aluminum gate metal 17 is employed with a thickness of 5,000 Å.

The gate structure 10 can easily be patterned by selectively patterning photoresist and performing a totally dry or a dry/wet etch process. The aluminum layer 17 can be eteched with a dry etch or a wet phosphoric acid solution. The silicon dioxide layer 16 and the amorphous silicon layer 13 can be etched with a dry $CF_4$ plasma etch. Finally the silicon dioxide layer 11 can be dry etched or wet etched with buffered hydrofluoric acid.

Although the invention has been described and illustrated with a certain degree of particularity, it is understood that the present disclosure has been made by way of example only and the numerous changes in the combination and arrangement of parts or steps may be resorted to by those skilled in the art without departing from the spirit and the scope of the invention as hereinafter claimed.

I claim:

1. A dual dielectric MOSFET gate system comprising:
    a monocrystalline substrate having a surface,
    a silicon dioxide layer at the surface of the substrate,
    and an undoped amorphous silicon layer over the silicon dioxide layer and out of direct contact with the substrate.

2. The dual dielectric gate system of claim 1 wherein said layer of silicon dioxide is formed by a rapid thermal oxidation.

3. The dual dielectric gate system of claim 2 wherein said layer of silicon dioxide is of thickness of between approximately 200 Å to 1,000 Å.

4. The dual dielectric gate system of claim 3 wherein the undoped layer of amorphous silicon on top of the silicon dioxide is of thickness of between about 500Å to 1,000 Å.

5. The dual dielectric gate system of claim 4 further comprising a second layer of silicon dioxide on said amorphous silicon layer of thickness of between about 100 Å to 200 Å.

6. The dual dielectric gate system of claim 1 wherein said substrate is of silicon counterdoped with germanium.

7. The dual dielectric gate system of claim 5 further comprising a gate metal over the second layer of silicon dioxide.

8. The dual dielectric gate system of claim 7 wherein said gate metal comprises an aluminum gate metal of thickness of about 5,000 Å.

9. A dual dielectric gate system comprising:
    a monocrystalline substrate;
    a first silicon dioxide dielectric film of thickness of between approximately 200 Å to 1,000 Å at a surface of the substrate;
    an undoped layer of amorphous silicon of thickness of between about 500 Å to 1,000 Å on the silicon dioxide;
    a second layer of silicon dioxide of thickness of between about 100 Å to 200 Å on the amorphous silicon to protect the dual dielectric gate from aluminum-amorphous silicon interphase reactions;
    and a gate metal on the second layer of silicon dioxide.

10. The dual dielectric gate system of claim 9 wherein said first layer of silicon dioxide is produced by rapid thermal oxidation.

11. The dual dielectric gate system of claim 9 wherein said gate metal comprises an aluminum of thickness of about 5,000 Å.

* * * * *